(12) United States Patent
Xu et al.

(10) Patent No.: US 12,156,429 B2
(45) Date of Patent: Nov. 26, 2024

(54) ARRAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yuanjie Xu, Beijing (CN); Benlian Wang, Beijing (CN); Yue Long, Beijing (CN); Lili Du, Beijing (CN); Yao Huang, Beijing (CN)

(73) Assignees: BEIJING BOE TECHNOLOGY DEVELOPMENT CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 488 days.

(21) Appl. No.: 17/607,493

(22) PCT Filed: Nov. 18, 2020

(86) PCT No.: PCT/CN2020/129717
§ 371 (c)(1),
(2) Date: Oct. 29, 2021

(87) PCT Pub. No.: WO2022/104584
PCT Pub. Date: May 27, 2022

(65) Prior Publication Data
US 2022/0352278 A1 Nov. 3, 2022

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H01L 27/15
See application file for complete search history.

(56) References Cited

U.S. PATENT DOCUMENTS 6,356,318 B1  3/2002  Kawahata
9,276,051 B2  3/2016  Sato
(Continued)

FOREIGN PATENT DOCUMENTS

CN  1905199 A    1/2007
CN  104795423 A  7/2015
(Continued)

OTHER PUBLICATIONS

Machine translation of Xu et al. (CN-109585425) (Year: 2019).*
Written Opinion for PCT Patent Application No. PCT/CN2020/129717 mailed Aug. 19, 2021.

*Primary Examiner* — Yasser A Abdelaziz
(74) *Attorney, Agent, or Firm* — Perilla Knox & Hildebrandt LLP; Kenneth A. Knox

(57) ABSTRACT

An array substrate and a display device are disclosed. The array substrate includes a base substrate, a first conductive layer, a second conductive layer, and a third conductive layer. The first conductive layer is located on a side of the base substrate and includes a first conductive portion for forming a gate of a drive transistor and a second conductive portion for forming a first electrode of a capacitor; the second conductive layer is arranged on a side of the first conductive layer away from the base substrate, and includes a third conductive portion for forming a second electrode of the capacitor, and an orthographic projection of the third conductive portion on the base substrate and an orthographic projection of the second conductive layer on the base substrate at least partially overlap.

19 Claims, 9 Drawing Sheets

(56) References Cited

U.S. PATENT DOCUMENTS

| | | |
|---|---|---|
| 9,520,455 B2 | 12/2016 | Oh |
| 9,620,577 B2 | 4/2017 | Choi |
| 10,658,455 B2 | 5/2020 | Hsu |
| 2015/0206929 A1 | 7/2015 | Sato |
| 2016/0005804 A1 | 1/2016 | Oh |
| 2016/0063916 A1* | 3/2016 | Ota ................ H10K 59/1216 |
| | | 345/206 |
| 2016/0141344 A1 | 5/2016 | Sato |
| 2016/0254337 A1 | 9/2016 | Choi |
| 2019/0096986 A1 | 3/2019 | Hsu |
| 2020/0279909 A1 | 9/2020 | Hsu |
| 2022/0375966 A1* | 11/2022 | Dong ................ H01L 24/05 |

FOREIGN PATENT DOCUMENTS

| | | |
|---|---|---|
| CN | 105280137 A | 1/2016 |
| CN | 106257677 A | 12/2016 |
| CN | 109449188 A | 3/2019 |
| CN | 109559667 A | 4/2019 |
| CN | 109585425 A | 4/2019 |
| CN | 110459578 A | 11/2019 |
| CN | 111725250 A | 9/2020 |
| WO | 2021032169 A1 | 2/2021 |

\* cited by examiner

ARRAY SUBSTRATE AND DISPLAY DEVICE

CROSS-REFERENCE TO RELATED APPLICATION

The present disclosure is a national phase application under 35 U.S.C. § 371 of International Application No. PCT/CN2020/129717 filed Nov. 18, 2020, the contents of which being incorporated by reference in their entirety herein.

TECHNICAL FIELD

The present disclosure relates to the field of display technology and, in particular to an array substrate and a display device.

BACKGROUND

In the related art, an organic light-emitting diode (OLED) display panel generally includes a pixel drive circuit, and the pixel drive circuit includes a drive transistor and a capacitor. The drive transistor may provide a driving current to a light-emitting unit through the charge in the capacitor during the light-emitting stage of the display panel. However, in a display panel with high pixel density, the layout space for setting the capacitor is small, such that the capacitor cannot meet required capacitance parameters.

It should be noted that the information disclosed in the background art section above is only used to enhance the understanding of the background of the present disclosure, and therefore may include information that does not constitute the prior art known to those of ordinary skill in the art.

SUMMARY

According to an aspect of the present disclosure, there is provided an array substrate, wherein the array substrate comprises a pixel drive circuit, and the pixel drive circuit comprises a drive transistor and a capacitor connected to a gate of the drive transistor, and the array substrate further comprises a base substrate, a first conductive layer, a second conductive layer and a third conductive layer. The first conductive layer is located on a side of the base substrate and comprises a first conductive portion and a second conductive portion, wherein the first conductive portion is used to form the gate of the drive transistor and an orthographic projection of the second conductive portion on the base substrate does not intersect with an orthographic projection of the first conductive portion on the base substrate, and the second conductive portion is used to form a part of a first electrode of the capacitor; the second conductive layer is disposed on a side of the first conductive layer away from the base substrate and comprises a third conductive portion, wherein an orthographic projection of the third conductive portion on the base substrate and the orthographic projection of the second conductive portion on the base substrate at least partially overlap, and the third conductive portion is electrically connected to the first conductive portion, and the third conductive portion is used to form a second electrode of the capacitor; the third conductive layer is disposed on a side of the second conductive layer away from the base substrate and comprises a fourth conductive portion, wherein an orthographic projection of the fourth conductive portion on the base substrate and the orthographic projection of the third conductive portion on the base substrate at least partially overlap, and the fourth conductive portion is electrically connected to the second conductive portion, and the fourth conductive portion is used to form a part of the first electrode of the capacitor.

In an exemplary embodiment of the present disclosure, the orthographic projection of the first conductive portion on the base substrate and the orthographic projection of the third conductive portion on the base substrate are distributed at intervals in a first direction, and the third conductive layer further comprises:
    a first connecting portion extending in the first direction on the orthographic projection of the base substrate, wherein the first connecting portion is electrically connected to the first conductive portion through a via hole, and the first connecting portion is electrically connected to the third conductive portion through a via hole.

In an exemplary embodiment of the present disclosure, the fourth conductive portion comprises a first sub-conductive portion; an orthographic projection of the first sub-conductive portion on the base substrate does not intersect with the orthographic projection of the third conductive portion on the base substrate, and the orthographic projection of the first sub-conductive portion on the base substrate and the orthographic projection of the second conductive portion on the base substrate at least partially overlap; and the first sub-conductive portion is electrically connected to the second conductive portion through a via hole.

In an exemplary embodiment of the present disclosure, the third conductive layer further comprises a power cord extending in the first direction, the orthographic projection of the third conductive portion on the base substrate is located on a side of an orthographic projection of the power cord on the base substrate in a second direction, and the first direction intersects with the second direction; wherein the fourth conductive portion is electrically connected to the power cord, and the orthographic projection of the fourth conductive portion on the base substrate is located on a side of an orthographic projection of the power cord on the base substrate in the second direction.

In an exemplary embodiment of the present disclosure, the array substrate comprises a plurality of pixel drive circuits; the first conductive layer comprises a plurality of second conductive portions, and orthographic projections of the plurality of second conductive portions on the base substrate are distributed at intervals in the second direction.

In an exemplary embodiment of the present disclosure, the third conductive layer comprises a plurality of power cords, the plurality of power cords are distributed at intervals in the second direction, and the plurality of power cords comprise adjacent first power cord and second power cord, the orthographic projection of the second power cord on the base substrate is located on a side of an orthographic projection of the first power cord on the base substrate in the second direction; and the second conductive portion is electrically connected to the first power cord through the first sub-conductive portion, and the second conductive portion is connected to the second power cord through a via hole.

In an exemplary embodiment of the present disclosure, the pixel drive circuit further comprises a second transistor, wherein a first electrode of the second transistor is connected to a first electrode of the drive transistor, a second electrode of the second transistor is connected to a gate of the drive transistor, the first conductive layer further comprises a first gate line, an orthographic projection of which on the base substrate extends in the second direction and is located between the orthographic projection of the first conductive portion on the base substrate and the orthographic projection of the second conductive portion on the base substrate, and a part of the first gate line is used to form a gate of the second transistor.

In an exemplary embodiment of the present disclosure, the pixel drive circuit further comprises a first transistor, wherein a first electrode of the first transistor is connected to the second electrode of the second transistor, and the first conductive layer further comprises a second gate line, an orthographic projection of which on the base substrate extends in the second direction and is located on a side of the orthographic projection of the second conductive portion on the base substrate away from the orthographic projection of the first gate line on the base substrate, and a part of the second gate line is used to form a gate of the first transistor.

In an exemplary embodiment of the present disclosure, the array substrate further comprises an active layer disposed between the base substrate and the first conductive layer, and the active layer comprises a first active portion, an orthographic projection of which on the base substrate extends in the first direction, and the first active portion is used to electrically connect the second electrode of the second transistor and the first electrode of the first transistor; wherein an orthographic projection of the first active portion on the base substrate penetrates a gap between orthographic projections of adjacent second conductive portions on the base substrate.

In an exemplary embodiment of the present disclosure, the third conductive layer further comprises: a fifth conductive portion connected between the fourth conductive portion and the power cord, wherein the power cord comprises a first edge, the fifth conductive portion comprises a second edge connected to the first edge, and an angle formed by an orthographic projection of the first edge on the base substrate and an orthographic projection of the second edge on the base substrate is less than 180°; and an orthographic projection of the fifth conductive portion on the base substrate and the orthographic projection of the first active portion on the base substrate at least partially overlap.

In an exemplary embodiment of the present disclosure, the first conductive layer further comprises a sixth conductive portion, an orthographic projection of which on the base substrate extends in the first direction and is connected to the first gate line; the active layer further comprises a second active portion, a third active portion and a fourth active portion, wherein an orthographic projection of the second active portion on the base substrate is located on the orthographic projection of the first gate line on the base substrate, and the second active portion is used to form a first channel region of the second transistor; an orthographic projection of the third active portion on the base substrate is located on the orthographic projection of the sixth conductive portion on the base substrate, and the third active portion is used to form a second channel region of the second transistor; the fourth active portion is connected between the second active portion and the third active portion, and an orthographic projection of the fourth active portion on the base substrate does not intersect with the orthographic projection of the first conductive layer on the base substrate; the third conductive layer further comprises a seventh conductive portion connected to the fourth conductive portion, wherein an orthographic projection of the seventh conductive portion on the base substrate and the orthographic projection of the fourth active portion on the base substrate at least partially overlap.

In an exemplary embodiment of the present disclosure, the active layer further comprises a fifth active portion connected between the third active portion and the first active portion, wherein an orthographic projection of the fifth active portion on the base substrate does not intersect with the orthographic projection of the first conductive layer on the base substrate; and the orthographic projection of the fifth active portion on the base substrate and the orthographic projection of the first connecting portion on the base substrate at least partially overlap, and the fifth active portion is electrically connected to the first connecting portion through a via hole.

In an exemplary embodiment of the present disclosure, the active layer further comprises a sixth active portion, wherein an orthographic projection of the sixth active portion on the base substrate is in a strip shape and extends in the second direction, and the sixth active portion is used to form a channel region of the drive transistor.

In an exemplary embodiment of the present disclosure, a size of the orthographic projection of the sixth active portion on the base substrate in the first direction is 1.1-1.5 times a size of the orthographic projection of the first gate line on the base substrate in the first direction.

In an exemplary embodiment of the present disclosure, the orthographic projection of the first conductive portion on the base substrate is in a strip shape extending in the second direction, and a size of the orthographic projection of the first conductive portion on the base substrate in the second direction is 2.5-5 times a size of the orthographic projection of the first conductive portion on the base substrate in the first direction.

In an exemplary embodiment of the present disclosure, the active layer further comprises a seventh active portion, an eighth active portion and a ninth active portion, wherein an orthographic projection of the seventh active portion on the base substrate is located on the orthographic projection of the second gate line on the base substrate, and is used to form the first channel region of the first transistor; an orthographic projection of the eighth active portion on the base substrate is located on the orthographic projection of the second gate line on the base substrate, and is used to form the second channel region of the first transistor; the ninth active portion is connected between the seventh active portion and the eighth active portion, wherein an orthographic projection of the ninth active portion on the base substrate do not intersect with the orthographic projection of the first conductive layer on the base substrate. The third conductive layer further comprises an eighth conductive portion electrically connected to the power cord; the power cord comprises a third edge, the eighth conductive portion comprises a fourth edge connected to the third edge, and an angle formed by an orthographic projection of the third edge on the base substrate and an orthographic projection of the fourth edge on the base substrate is less than 180°; and an orthographic projection of the eighth conductive portion on the base substrate and the orthographic projection of the ninth active portion on the base substrate at least partially overlap.

In an exemplary embodiment of the present disclosure, the third conductive layer further comprises a plurality of data lines, and orthographic projections of the plurality of data lines on the base substrate are distributed at intervals in the second direction and extend in the first direction; the plurality of data lines comprise a first data line, and an orthographic projection of the first data line on the base substrate is located between the orthographic projection of the second power cord on the base substrate and the orthographic projection of the fourth conductive portion on the base substrate; and the orthographic projection of the first data line on the base substrate and the orthographic projection of the second conductive portion on the base substrate at least partially overlap.

According to an aspect of the present disclosure, there is provided a display device including the above-mentioned array substrate.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and together with the specification are used to explain the principle of the present disclosure. Understandably, the drawings in the following description are only some embodiments of the present disclosure. For those of ordinary skill in the art, other drawings may be obtained based on these drawings without creative work.

DETAILED DESCRIPTION

Figure 1:
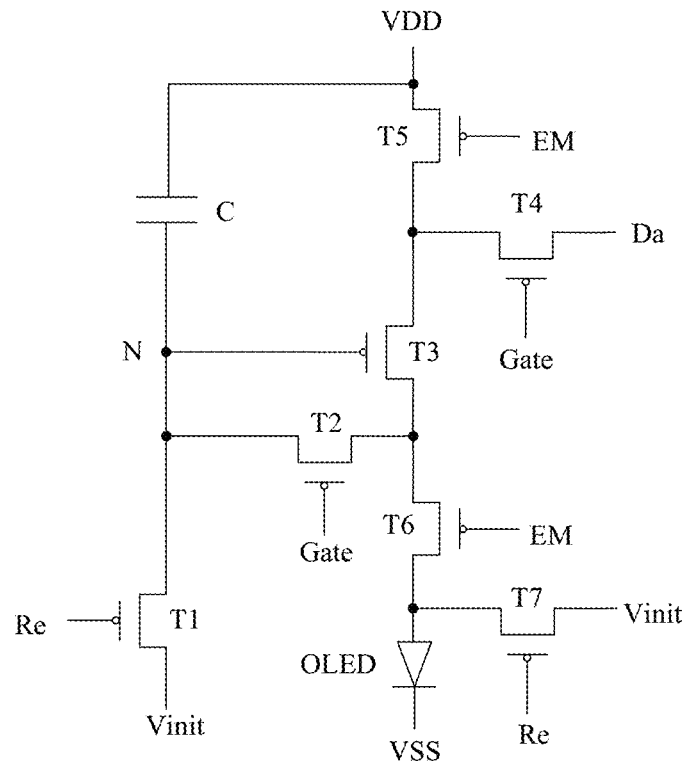
FIG. 1 is a schematic diagram of a circuit structure of a pixel drive circuit of the present disclosure.

Example embodiments will now be described more fully with reference to the accompanying drawings. However, the example embodiments may be implemented in various forms, and should not be construed as being limited to the examples set forth herein; on the contrary, these embodiments are provided to make the present disclosure more comprehensive and complete, and fully convey the concept of the example embodiments to those skilled in the art. The same reference numerals in the figures indicate the same or similar structures, and thus their detailed descriptions will be omitted.

Although relative terms such as "upper" and "lower" are used in this specification to describe the relative relationship between labeled one component and another component, these terms are used in this specification only for convenience, for example, exemplary directions as shown according to the drawings. It may be understood that if the labeled device is turned over and turned upside down, the component described as "upper" will become the "lower" component. Other relative terms, such as "high", "low", "top", "bottom", "left", and "right" have similar meanings. When a structure is "on" another structure, it may mean that a certain structure is integrally formed on other structures, or that a certain structure is "directly" arranged on other structures, or that a certain structure is "indirectly" arranged on other structures through another structure.

The terms "a", "an", and "the" are used to indicate the presence of one or more elements/components/etc.; the terms "include" and "comprise" are used to mean open-ended inclusion and means that there may be additional elements/components/etc. in addition to the listed elements/components/etc.

As shown in FIG. 1, it is a schematic diagram of a circuit structure of a pixel drive circuit of the present disclosure. The pixel drive circuit may include a first transistor T1, a second transistor T2, a drive transistor T3, a fourth transistor T4, a fifth transistor T5, a sixth transistor T6, a seventh transistor T7, and a capacitor C. The first transistor T1 has a first electrode connected to a node N, a second electrode connected to an initialization signal terminal Vinit, and a gate connected to a reset signal terminal Re; the second transistor T2 has a first electrode connected to a first electrode of the drive transistor T3, a second electrode connected to the node N, and a gate connected to a gate driving signal terminal Gate; the drive transistor T3 has a gate connected to the node N; the fourth transistor T4 has a first electrode connected to a data signal terminal Da, a second electrode connected to a second electrode of the drive transistor T3, and a gate connected to the gate driving signal terminal Gate; the fifth transistor T5 has a first electrode connected to a first power signal terminal VDD, a second electrode connected to the second electrode of the drive transistor T3, and a gate connected to an enable signal terminal EM; the sixth transistor T6 has a first electrode connected to the first electrode of the drive transistor T3, and a gate connected to the enable signal terminal EM; and the seventh transistor T7 has a first electrode connected to the initialization signal terminal Vinit, and a second electrode connected to a second electrode of the sixth transistor T6. The pixel drive circuit may be connected to a light-emitting unit OLED for driving the light-emitting unit OLED to emit light, and the light-emitting unit OLED may be connected between the second electrode of the sixth transistor T6 and a second power terminal VSS. In some embodiments, all of the transistors T1-T7 may be P-type transistors.

Figure 2:
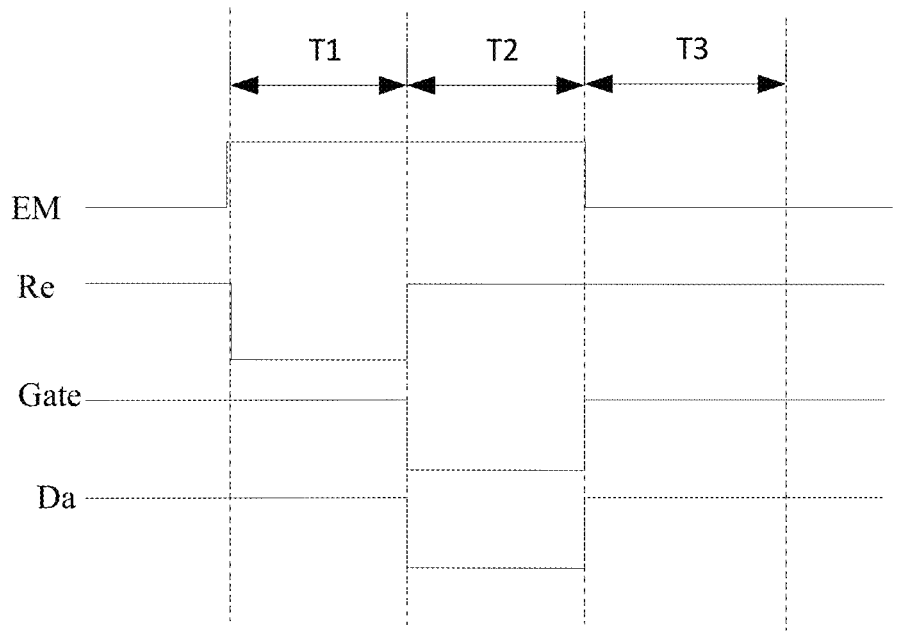
FIG. 2 is a timing diagram of each node in a driving method of the pixel drive circuit of FIG. 1.

As shown in FIG. 2, a timing diagram is provided of each node in a driving method of the pixel drive circuit of FIG. 1. "Gate" represents the timing of the gate drive signal terminal Gate, "Re" represents the timing of the reset signal terminal Re, "EM" represents the timing of the enable signal terminal EM, and "Da" represents the timing of the data signal terminal Da. The driving method of the pixel drive circuit may include a reset phase t1, a compensation phase t2, and a light-emitting phase t3. In the reset phase t1: the reset signal terminal Re outputs a low-level signal, the first transistor T1 and the seventh transistor T7 are turned on, and the initialization signal terminal Vinit inputs an initialization signal to the node N and the second electrode of the sixth transistor T6. In the compensation stage t2: the gate drive signal terminal Gate outputs a low level signal, and the fourth transistor T4 and the second transistor T2 are turned on, while the data signal terminal Da outputs a drive signal to write a voltage Vdata+Vth to the node N, where "Vdata" is a voltage of the drive signal, and "Vth" is a threshold voltage of the drive transistor T3. In the light-emitting phase t3: the enable signal terminal EM outputs a low-level signal, the sixth transistor T6 and the fifth transistor T5 are turned on, and the drive transistor T3 emits light under the action of the voltage Vdata+Vth stored in the capacitor C. According to the output current formula of the drive transistor I=$(\mu WCox/2L)(Vgs-Vth)^2$, where "$\mu$" is a carrier mobility; "Cox" is a gate capacitance per unit area, "W" is a width of a channel of the drive transistor, "L" is a length of the channel of the drive transistor, "Vgs" is a gate-source voltage difference of the drive transistor, and "Vth" is a threshold voltage of the drive transistor. The output current I of the drive transistor in the pixel drive circuit of the present disclosure=$(\mu WCox/2L)(Vdata+Vth-Vdd-Vth)^2$. The pixel drive circuit may avoid the influence of the threshold value of the drive transistor on its output current.

Figure 3:
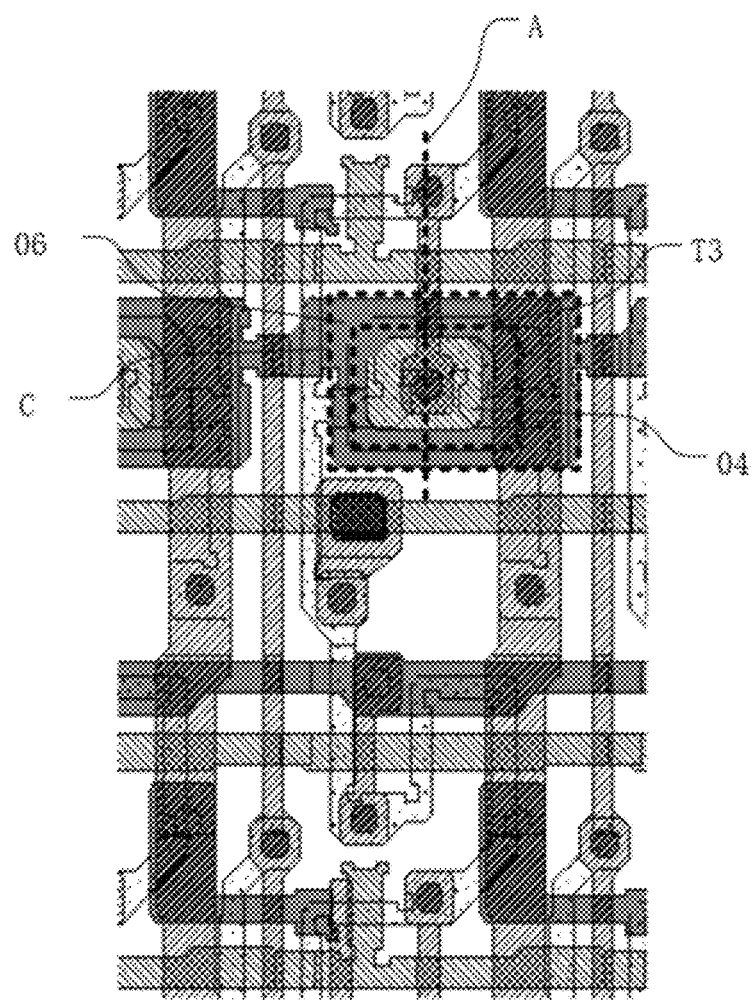
FIG. 3 is a structural layout of an array substrate in the related art.
Figure 4:
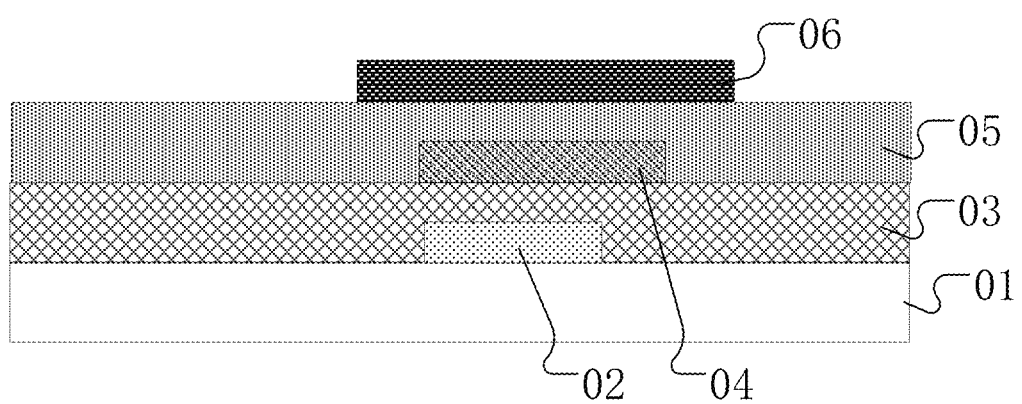
FIG. 4 is a partial cross-sectional view along the dashed line A in FIG. 3.

As shown in FIGS. 3 and 4, FIG. 3 is a structural layout of an array substrate in the related art, and FIG. 4 is a partial cross-sectional view along the dashed line A in FIG. 3. The array substrate shown in FIG. 3 may form the pixel drive circuit shown in FIG. 1. As shown in FIGS. 3 and 4, in the related art, the array substrate includes a base substrate 01, an active layer (including an active portion 02) located on a side of the base substrate 01, a first gate insulating layer 03 located on a side of the active layer away from the base substrate, a first gate layer (including a gate portion 04) located on a side of the first gate insulating layer 03 away from the base substrate, a second gate insulating layer 05 located on a side of the first gate layer away from the base substrate, and a second gate layer (including a gate portion 06) located on a side of the second gate insulating layer 05 away from the base substrate. The active portion 02 may form a channel region of the drive transistor T3 in FIG. 1, the gate part 04 may form the gate of the drive transistor T3 in FIG. 1, and the gate part 06 and the gate part 04 may form a capacitance C in FIG. 1. However, the layout areas of the gate portion 06 and the gate portion 04 are limited, and the capacitance value of the capacitor C often cannot reach the preset capacitance parameter.

Figure 5:
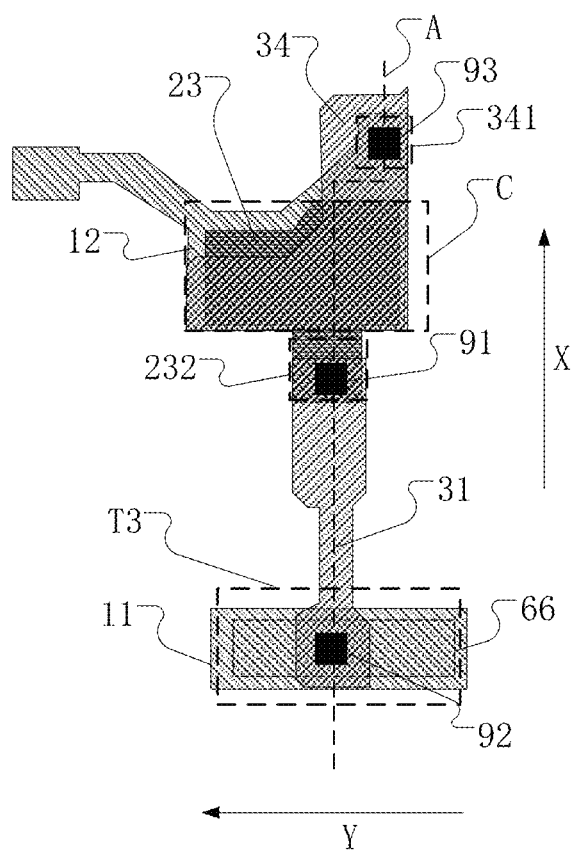
FIG. 5 is a partial structural layout of an array substrate of an exemplary embodiment of the present disclosure.
Figure 6:
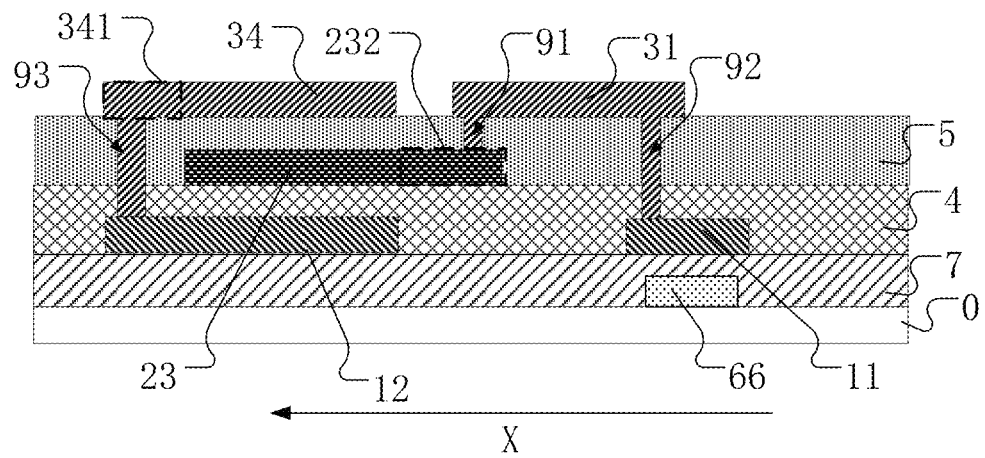
FIG. 6 is a cross-sectional view along the dashed line A in FIG. 5.
Figure 7:
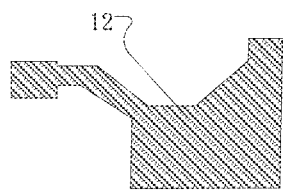
FIG. 7 is a structural layout of a first conductive layer in FIG. 6.
Figure 7:
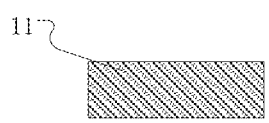
Figure 8:
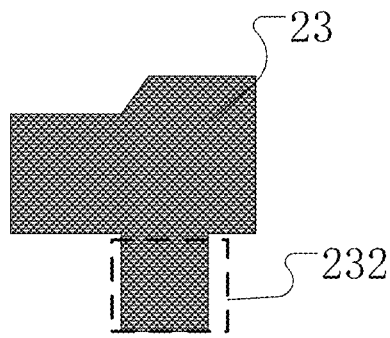
FIG. 8 is a structural layout of a second conductive layer in FIG. 6.
Figure 9:
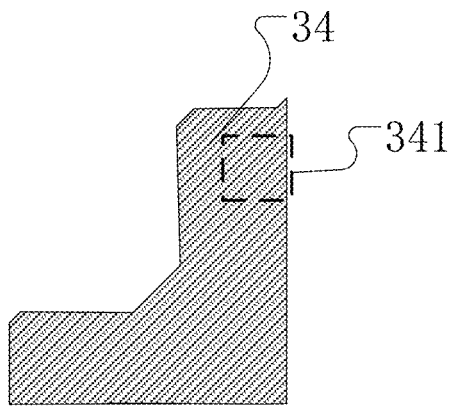
FIG. 9 is a structural layout of a third conductive layer in FIG. 6.

Based on this, the exemplary embodiment provides an array substrate, as shown in FIGS. 5, 6, 7, 8, and 9. FIG. 5 is a partial structural layout of an array substrate of an exemplary embodiment of the present disclosure, FIG. 6 is a cross-sectional view along the dashed line A in FIG. 5, FIG. 7 is a structural layout of a first conductive layer in FIG. 6, FIG. 8 is a structure layout of a second conductive layer in FIG. 6, and FIG. 9 is a structure layout of a third conductive layer in FIG. 6. The array substrate may include a pixel drive circuit, and the pixel drive circuit may be as shown in FIG. 1. The array substrate may further include a base substrate 0, a first conductive layer, a second conductive layer and a third conductive layer. The first conductive layer may be located on a side of the base substrate 0, the first conductive layer may include a first conductive portion 11 and a second conductive portion 12, and the first conductive portion 11 may be used to form the gate of the drive transistor T3; an orthographic projection of the second conductive portion 12 on the base substrate 0 may not intersect with an orthographic projection of the first conductive portion 11 on the base substrate 0, and the second conductive portion 12 may be used to form a part of a first electrode of the capacitor C; the second conductive layer may be disposed on a side of the first conductive layer away from the base substrate 0, the second conductive layer may include a third conductive portion 23, and an orthographic projection of the third conductive portion 23 on the base substrate may at least partially overlap with the orthographic projection of the second conductive portion on the base substrate, the third conductive portion 23 is electrically connected to the first conductive portion 11, and the third conductive portion 23 may be used to form a second electrode of the capacitor C; the third conductive layer may be disposed on a side of the second conductive layer away from the base substrate 0, the third conductive layer may include a fourth conductive portion 34, an orthographic projection of the fourth conductive portion 34 on the base substrate may at least partially overlap with the orthographic projection of the third conductive portion 23 on the base substrate, the fourth conductive portion 34 may be electrically connected to the second conductive portion 12, and the fourth conductive portion 34 may be used to form a part of the first electrode of the capacitor C.

In this exemplary embodiment, the third conductive portion 23 may serve as the second electrode of the capacitor C, and the second conductive portion 12 and the fourth conductive portion 34 may collectively serve as the first electrode of the capacitor C. The third conductive portion 23 may form a parallel plate capacitor structure with the second conductive portion 12 and the fourth conductive portion 34 respectively, that is, the capacitor C may be composed of the two parallel plate capacitor structures described above in parallel, so that the capacitor C has a larger capacitance value.

It should be understood that in other exemplary embodiments, the pixel drive circuit in the array substrate of the present disclosure may also have other structures. As long as the pixel drive circuit includes a drive transistor and a capacitor connected to the gate of the drive transistor, the array substrate may realize a capacitor with a larger capacitance value through the above-mentioned structure.

In this exemplary embodiment, as shown in FIG. 6, the array substrate may further include a first gate insulating layer 4 located between the first conductive layer and the second conductive layer, and a dielectric layer 5 located between the second conductive layer and the third conductive layer. The first gate insulating layer 4 may be a silicon oxide layer, and the dielectric layer 5 may be a silicon nitride layer. Each of the first conductive layer, the second conductive layer and the third conductive layer may be formed by at least one metal layer. For example, the first conductive layer, the second conductive layer and the third conductive layer may be formed by sequentially stacking a first titanium layer, an aluminum layer and a second titanium layer. The base substrate may be formed of an insulating material. For example, the base substrate may include a first polyimide (PI) layer, a first silicon oxide (SiO) layer, an amorphous silicon layer, a second polyimide (PI) layer, and a second silicon dioxide layer which are sequentially arranged.

In this exemplary embodiment, as shown in FIGS. 5 and 6, the orthographic projection of the first conductive portion 11 on the base substrate and the orthographic projection of the third conductive portion 23 on the base substrate may be distributed at intervals in the first direction X. The third conductive portion 23 may include a second sub-conductive portion 232, and an orthographic projection of the second sub-conductive portion 232 on the base substrate does not intersect with the orthographic projection of the fourth conductive portion 34 on the base substrate. The third conductive layer may further include a first connecting portion 31. An orthographic projection of the first connecting portion 31 on the base substrate may extend in the first direction X, the first connecting portion 31 may be electrically connected to the first conductive portion 11 through a via hole 92, and the first connection portion 31 may be electrically connected to the second sub-conductive portion 232 through a via hole 91. With reference to FIG. 1, the first conductive portion 11 is actually used to connect the gate of the drive transistor T3 and the second electrode of the capacitor C.

In this exemplary embodiment, as shown in FIGS. 5, 6, and 8, the fourth conductive portion 34 may include a first sub-conductive portion 341; an orthographic projection of the first sub-conductive portion 341 on the base substrate may not intersect with the orthographic projection of the third conductive portion 23 on the base substrate, and the orthographic projection of the first sub-conductive portion 341 on the base substrate and the orthographic projection of the second conductive portion 12 on the base substrate at least partially overlap. The first sub-conductive portion 341 may be electrically connected to the second conductive portion 12 through a via hole 93, so that the fourth conductive portion 34 and the second conductive portion 12 are electrically connected. It should be understood that in other exemplary embodiments, the fourth conductive portion 34 and the second conductive portion 12 may also be connected by other structures. For example, the fourth conductive portion 34 may be electrically connected to the second conductive portion 12 through a via hole penetrating the third conductive portion 23 and insulated from the third conductive portion 23.

Figure 10:
FIG. 10 is the layout structure of an active layer in FIG. 6.

In this exemplary embodiment, as shown in FIGS. 5, 6, and 10, FIG. 10 is the layout structure of the active layer in FIG. 5. In this exemplary embodiment, the array substrate may further include an active layer, and the active layer may be located between the base substrate and the first conductive layer. As shown in FIGS. 5, 6, and 10, the active layer may include a sixth active portion 66, an orthographic projection of the sixth active portion 66 on the base substrate may be in a stripe shape and extend in the second direction Y, and the sixth active portion 66 may be used to form a channel region of the drive transistor T3. The first conductive portion 11 may also be in a strip structure extending in the second direction Y, and the orthographic projection of the first conductive portion 11 on the base substrate may cover the orthographic projection of the sixth active portion 66 on the base substrate. The second direction Y may intersect with the first direction X, for example, the second direction Y may be perpendicular to the first direction. In this exemplary embodiment, the channel region of the drive transistor T3 is arranged in a stripe structure extending in the second direction, so that a size of the drive transistor T3 in the first direction may be reduced, so as to reserve a space in the first direction X for disposing the capacitor C. Specifically, the sixth active portion 66 and the first conductive portion 11 may have a structure, such as a rectangle or a rounded rectangle. A size of the orthographic projection of the first conductive portion 11 on the base substrate in the second direction may be 2.5-5 times a size thereof in the first direction, for example, 2.2 times, 3.5 times, 4 times, and 5 times. In addition, as shown in FIG. 6, the array substrate may further include a second gate insulating layer 7 between the active layer and the first conductive layer, and the second gate insulating layer 7 may also be a silicon oxide layer.

Figure 11:
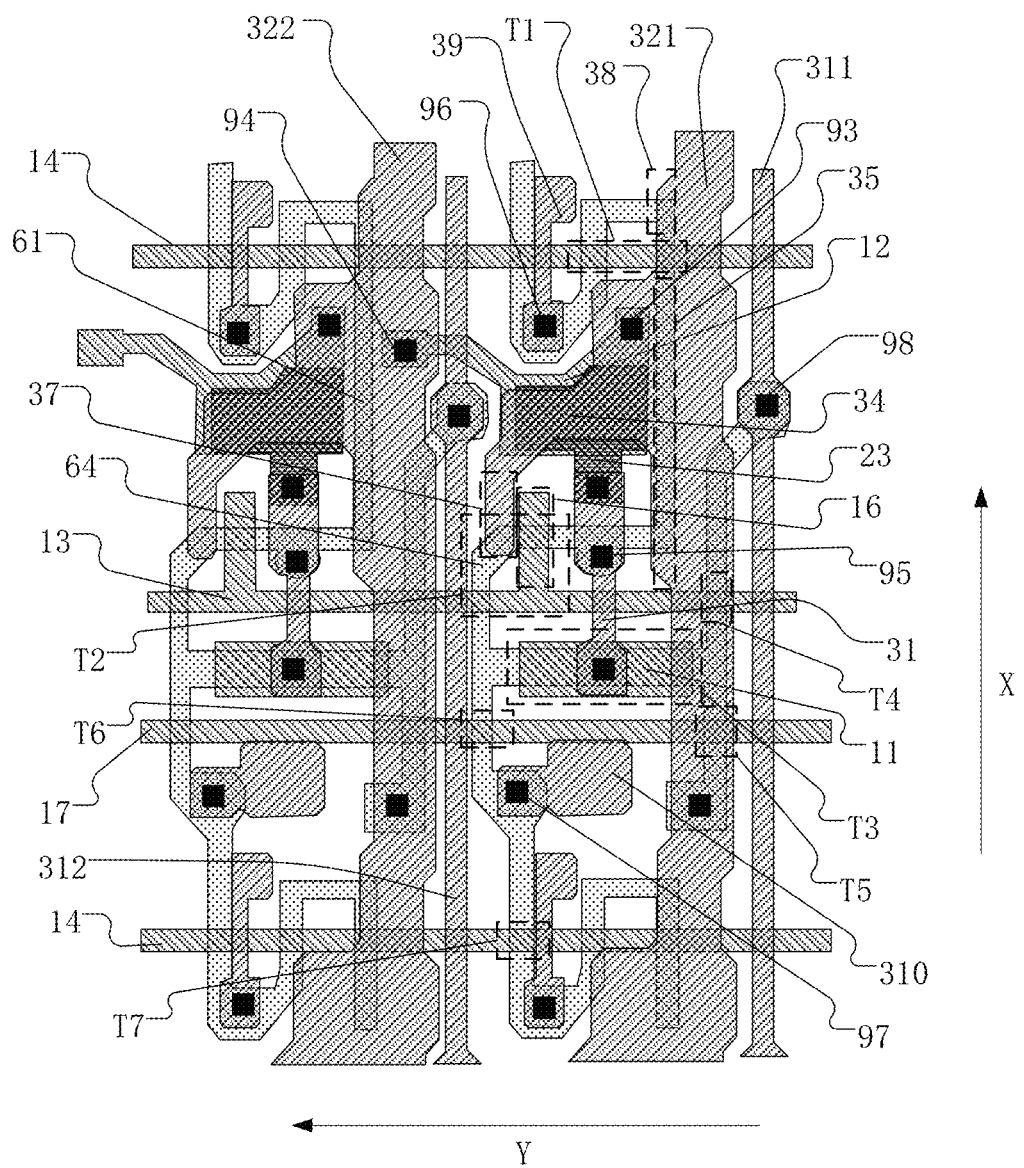
FIG. 11 is a structural layout of an array substrate of another exemplary embodiment of the present disclosure.
Figure 12:
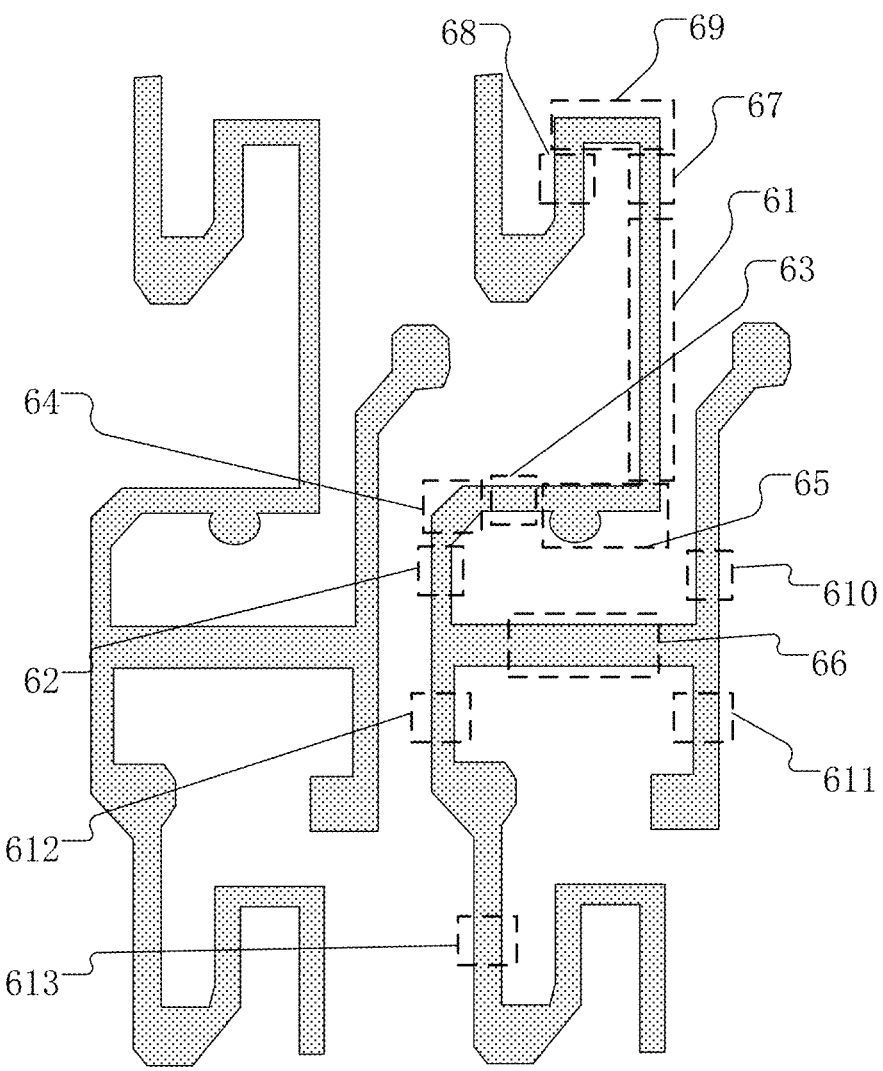
FIG. 12 is a structural layout of an active layer in FIG. 11.
Figure 13:
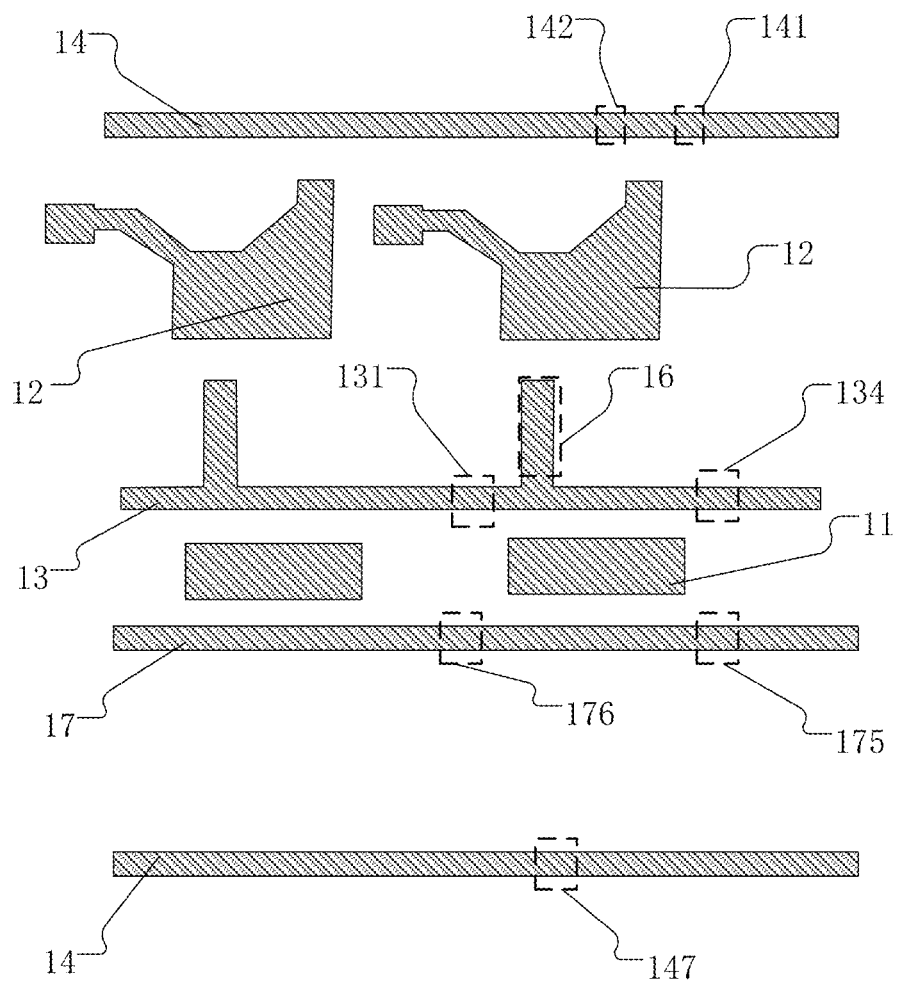
FIG. 13 is a structural layout of a first conductive layer in FIG. 11.
Figure 14:
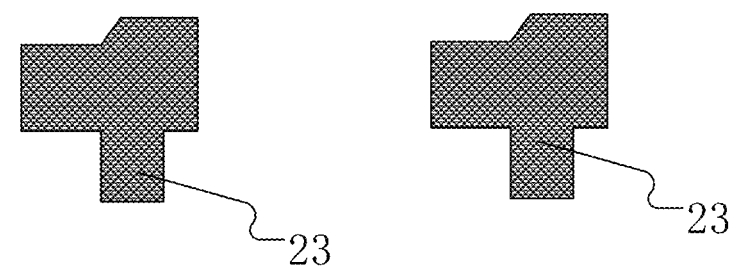
FIG. 14 is a structural layout of a second conductive layer in FIG. 11.
Figure 15:
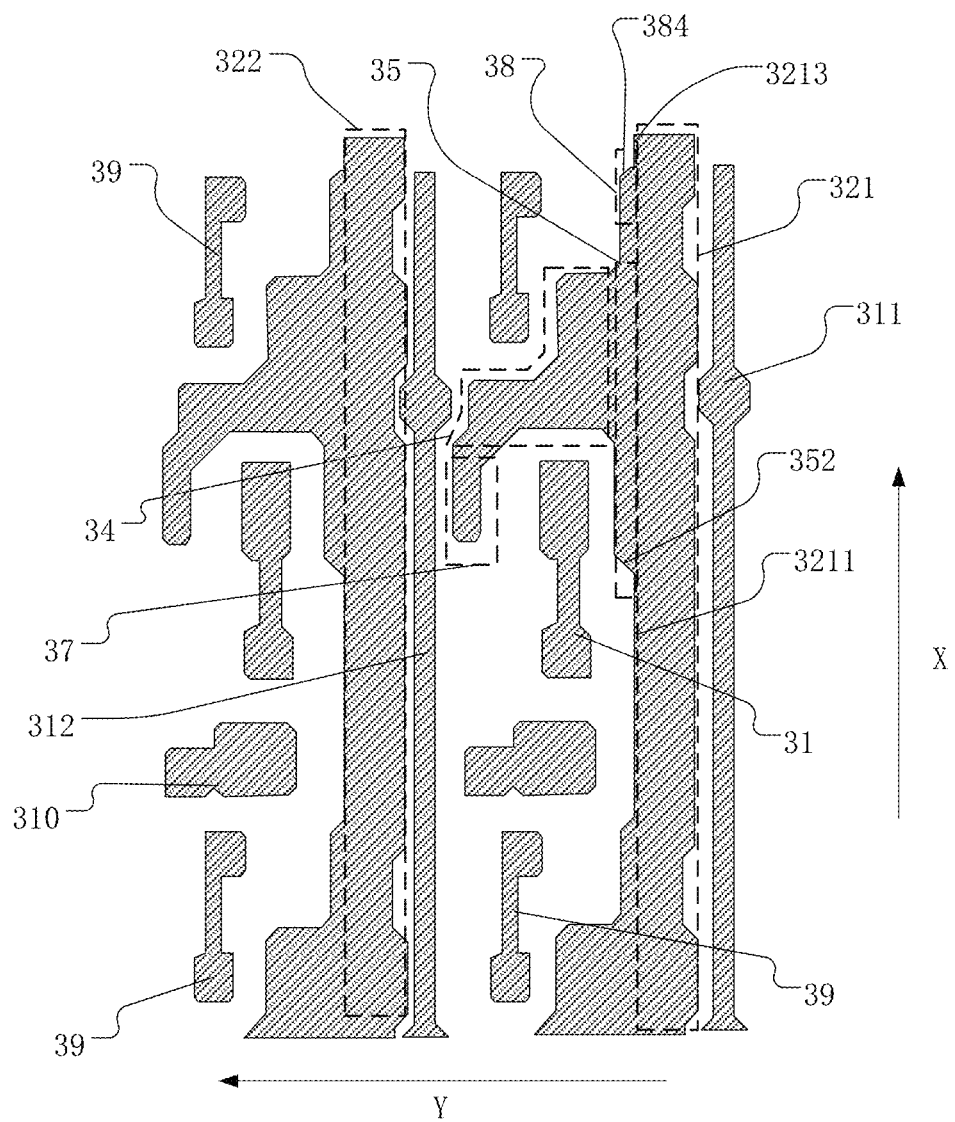
FIG. 15 is a structural layout of a third conductive layer in FIG. 11.

In this exemplary embodiment, as shown in FIGS. 11, 12, 13, 14, and 15, FIG. 11 is a structural layout of an array substrate of another exemplary embodiment of the present disclosure, FIG. 12 is a structural layout of an active layer in FIG. 11, FIG. 13 is a structural layout of an first conductive layer in FIG. 11, FIG. 14 is a structural layout of an second conductive layer in FIG. 11, and FIG. 15 is a structural layout of an third conductive layer in FIG. 11.

The array substrate shown in FIG. 11 may include any structure of the array substrate shown in FIGS. 5-10. Based on the array substrate shown in FIGS. 5-10, as shown in FIGS. 11 and 15, the third conductive layer may further include a power cord 321 extending in the first direction X, and the orthographic projection of the third conductive portion 23 on the base substrate may be located on a side of an orthographic projection of the power cord 321 on the base substrate in the second direction Y. The fourth conductive portion 34 may be electrically connected to the power cord 321, and the orthographic projection of the fourth conductive portion 34 on the base substrate may be located on a side of the orthographic projection of the power cord 321 on the base substrate in the second direction Y. The power cord 321 may be used to provide the first power terminal signal VDD in FIG. 1 so as to provide a power signal to the first electrode of the capacitor C.

In this exemplary embodiment, as shown in FIGS. 11 and 13, the array substrate may include a plurality of pixel drive circuits; the first conductive layer may include a plurality of second conductive portions 12, and orthographic projections of the plurality of second conductive portions 12 on the base substrate are distributed at intervals in the second direction Y. In this exemplary embodiment, as shown in FIGS. 11 and 15, the third conductive layer may include a plurality of power cords, and the plurality of power cords may be distributed at intervals in the second direction Y. The plurality of power cords may include adjacent power cord 321 and power cord 322, and an orthographic projection of the power cord 322 on the base substrate may be located on a side of the power cord 321 on the base substrate in the second direction Y. The second conductive portion 12 may be electrically connected to the power cord 321 through the aforementioned first sub-conductive portion 341, and at the same time, the second conductive portion 12 may also be electrically connected to the power cord 322 through a via hole 94. The second conductive portion 12 is connected to two adjacent power cords at the same time, so that the uniformity of the power supply voltage on the second conductive portion 12 may be improved.

In this exemplary embodiment, the pixel drive circuit in the array substrate may further include a first transistor and a second transistor. A first electrode of the second transistor is connected to the first electrode of the drive transistor, and a second electrode of the second transistor is connected to the gate of the drive transistor. A first electrode of the first transistor is connected to the second electrode of the second transistor. For example, the first transistor may be the first transistor T1 as shown in FIG. 1, and the second transistor may be the second transistor T2 as shown in FIG. 1. As shown in FIGS. 11 and 13, the first conductive layer may further include a first gate line 13, and the first gate line 13 may be used to provide the gate driving signal terminal in FIG. 1. An orthographic projection of the first gate line 13 on the base substrate may extend in the second direction Y, and the orthographic projection of the first gate line 13 on the base substrate may be located between the orthographic projection of the first conductive portion 11 on the base substrate and the orthographic projection of the second conductive portion 12 on the base substrate, an a portion of a conductive portion 131 of the first gate line 13 may be used to form a first gate of the second transistor T2. The first conductive layer may further include a second gate line 14, and the second gate line 14 may be used to provide the reset signal terminal in FIG. 1. An orthographic projection of the second gate line 14 on the base substrate extends in the second direction Y, and the orthographic projection of the second gate line 14 on the base substrate may be located on a side of the orthographic projection of the second conductive portion 12 on the base substrate away from the orthographic projection of the first gate line 13 on the base substrate. A part of the conductive portion 141 of the second gate line 14 may be used to form a first gate of the first transistor T1. A part of the conductive portion 142 of the second gate line 14 may be used to form a second gate of the first transistor T1.

In this exemplary embodiment, as shown in FIGS. 11 and 12, the active layer may further include a first active portion 61, an orthographic projection of the first active portion 61 on the base substrate extends in the first direction X, and the first active portion 61 may be used to electrically connect the second electrode of the second transistor T2 and the first electrode of the first transistor T1. The orthographic projection of the first active portion 61 on the base substrate may penetrate through a gap between orthographic projections of the adjacent second conductive portions 12 on the base substrate. The original material for forming the active layer may be a semiconductor. During the manufacturing process of the array substrate, the active layer may be processed as a conductor with the first conductive layer as a mask, so that the semiconductor structure outside the channel region of the transistor may be converted into a conduction structure. The second conductive portions 12 are arranged at intervals in the second direction Y, and a gap for routing the first active portion 61 may be reserved between adjacent second conductive portions 12.

In this exemplary embodiment, as shown in FIGS. 11 and 15, the third conductive layer may further include a fifth conductive portion 35, and the fifth conductive portion 35 may be connected between the fourth conductive portion 34 and the power cord 321. The power cord 321 may include a first edge 3211, the fifth conductive portion 35 may include a second edge 352 connected to the first edge 3211, and an angle formed by an orthographic projection of the first edge 3211 on the base substrate and an orthographic projection of the second edge 352 on the base substrate may be less than 180°. That is, the fifth conductive portion 35 may protrude from the power cord 321 in the second direction Y. The orthographic projection of the fifth conductive portion 35 on the base substrate and the orthographic projection of the first active portion 61 on the base substrate at least partially overlap. The fifth conductive portion 35 and the first active portion 61 may form a parallel plate capacitor structure, and the parallel plate capacitor structure may form a parallel structure with a parallel plate capacitor structure formed by the fourth conductive portion 34 and the third conductive portion 23, and thereby this arrangement may further increase the capacitance value of capacitor C.

In this exemplary embodiment, as shown in FIGS. 11 and 13, the first conductive layer may further include a sixth conductive portion 16, an orthographic projection of the sixth conductive portion 16 on the base substrate may be extend in the first direction X, and the sixth conductive portion 16 is connected to the first gate line 13. Specifically, as shown in FIG. 13, the sixth conductive portion 16 may extend from the first gate line 13 in the first direction X. As shown in FIG. 12, the active layer may further include a second active portion 62, a third active portion 63 and a fourth active portion 64. An orthographic projection of the second active portion 62 on the base substrate is located on the orthographic projection of the first gate line 13 on the base substrate, and the second active portion 62 may be used to form a first channel region of the second transistor T2; an orthographic projection of the third active portion 63 on the base substrate may be located on an orthographic projection of the sixth conductive portion 16 on the base substrate, and the third active portion 63 may be used to form a second channel region of the second transistor T2. The fourth active portion 64 may be connected between the second active portion and the third active portion, and an orthographic projection of the fourth active portion 64 on the base substrate does not intersect with the orthographic projection of the first conductive layer on the base substrate. As shown in FIG. 11, the second transistor T2 has a double-gate structure, and the second transistor T2 in the double-gate structure has a smaller leakage current, which may reduce the leakage current of the capacitor C through the second transistor during the light-emitting phase of the pixel drive circuit. However, since the fourth active portion 64 is a conductor, a parasitic capacitance is formed between the fourth active portion 64 and a part of the first gate line 13 and the sixth conductive portion 16. When the voltage on the first gate line 13 changes, based on the bootstrap effect of the capacitor, the voltage of the fourth active portion 64 will also change accordingly, which will cause the leakage current from the fourth active portion 64 to the source and drain of the second transistor T2, and finally cause the pixel drive circuit to drive abnormally.

In this exemplary embodiment, as shown in FIGS. 11 and 15, the third conductive layer may further include a seventh conductive portion 37, the seventh conductive portion 37 may be connected to the fourth conductive portion 34, and an orthographic projection of the seventh conductive portion 37 on the base substrate and the orthographic projection of the fourth active portion 64 on the base substrate at least partially overlap. This arrangement may make the seventh conductive portion 37 and the fourth active portion 64 form a parallel plate capacitor structure. Since the seventh conductive portion 37 is connected to the power cord, the seventh conductive portion 37 has a stable voltage, so that the seventh conductive portion 37 may suppress the potential changes of the fourth active portion 64, thereby reducing the leakage current from the fourth active portion 64 to the source and drain of the second transistor T2.

In this exemplary embodiment, as shown in FIGS. 11 and 12, the active layer may further include a fifth active portion 65, and the fifth active portion 65 may be connected between the third active portion 63 and the first active portion 61. An orthographic projection of the fifth active portion 65 on the base substrate may extend in the second direction, and the orthographic projection of the fifth active portion 65 on the base substrate does not intersect with the orthographic projection of the first conductive layer on the base substrate; and the orthographic projections of the fifth active portion 65 on the base substrate and the orthographic projection of the first connection portion 31 on the base substrate at least partially overlap, and the fifth active portion 65 may be electrically connected to the first connecting portion 31 through a via hole 95. This arrangement may make the second electrode of the second transistor T2 electrically connect to the gate of the drive transistor.

In this exemplary embodiment, as shown in FIGS. 11, 12 and 15, the active layer may further include a seventh active portion 67, an eighth active portion 68, and a ninth active portion 69. An orthographic projection of the seventh active portion 67 on the base substrate may be located on the orthographic projection of the second gate line 14 on the base substrate, for forming a first channel region of the first transistor T1; an orthographic projection of the eighth active portion 68 on the base substrate may be located on the orthographic projection of the second gate line 14 on the base substrate, for forming a second channel region of the first transistor T1; the ninth active portion 69 may be connected between the seventh active portion 67 and the eighth active portion 68. An orthographic projection of the ninth active portion 69 on the base substrate does not intersect with the orthographic projection of the first conductive layer on the base substrate, and the orthographic projection of the ninth active portion 69 on the base substrate may be located on a side of the orthographic projection of the second gate line 14 on the base substrate away from the orthographic projection of the first gate line 13 on the base substrate. Similarly, the first transistor T1 has a double-gate structure, and the first transistor T1 in the double-gate structure has a smaller leakage current, which may reduce the leakage current of the capacitor C through the first transistor during the light-emitting phase of the pixel drive circuit. However, since the ninth active portion 69 is a conductor, there is a parasitic capacitance between the ninth active portion 69 and a part of the second gate line 14. When the voltage on the second gate line 14 changes, based on the bootstrap effect of the capacitance, the voltage of the ninth active portion 69 will also change accordingly, which will cause the leakage current from the ninth active portion 69 to the source and drain of the first transistor T1, and eventually cause the pixel drive circuit to drive abnormally.

In this exemplary embodiment, as shown in FIG. 15, the third conductive layer may further include an eighth conductive portion 38, and the eighth conductive portion 38 may be electrically connected to the power cord 321. The power cord 321 includes a third edge 3213, the eighth conductive portion 38 includes a fourth edge 384 connected to the third edge 3213, and an angle formed by an orthographic projection of the third edge 3213 on the base substrate and an orthographic projection of the fourth edge 384 on the base substrate is less than 180°. That is, the eighth conductive portion 38 protrudes from the power cord 321 in the second direction. The orthographic projection of the eighth conductive portion 38 on the base substrate may at least partially overlap with the orthographic projection of the ninth active portion 69 on the base substrate. This arrangement may make the eighth conductive portion 38 and the ninth active portion 69 form a parallel plate capacitor structure. Since the eighth conductive portion 38 is connected to the power cord, the eighth conductive portion 38 has a stable voltage, so that the eighth conductive portion 38 may suppress the potential changes of the ninth active portion 69, thereby reducing the leakage current from the ninth active portion 69 to the source and drain of the first transistor T1.

In this exemplary embodiment, as shown in FIGS. 10 and 12, a size of the orthographic projection of the sixth active portion 66 on the base substrate in the first direction X may be 1.1-1.5 times a size of the orthographic projection of the first gate line 13 on the base substrate in the first direction, for example, 1.1 times, 1.3 times, and 1.5 times. A size of the orthographic projection of the first conductive portion 11 on the base substrate in the first direction may be 1.5-2.5 times the size of the orthographic projection of the first gate line 13 on the base substrate in the first direction, for example, 1.5 times, 2 times, 2.5 times.

As shown in FIG. 11, the array substrate provided by this exemplary embodiment may form the pixel drive circuit as shown in FIG. 1. The array substrate may further include a fourth transistor T4, a fifth transistor T5, a sixth transistor T6 and a seventh transistor T7.

As shown in FIG. 12, the active layer may further include a tenth active portion 610, an eleventh active portion 611, a twelfth active portion 612, and a thirteenth active portion 613. The tenth active portion 610 may be used to form a channel region of the fourth transistor T4; the eleventh active portion 611 may be used to form a channel region of the fifth transistor T5; the twelfth active portion 612 may be used to form a channel region of the sixth transistor T6; and the thirteenth active portion 613 may be used to form a channel region of the seventh transistor.

As shown in FIG. 13, the first conductive layer may further include a third gate line 17, and the third gate line 17 may be used to provide the enable signal terminal in FIG. 1. An orthographic projection of the third gate line 17 on the base substrate may be located on a side of the orthographic projection of the first conductive portion 11 on the base substrate away from the orthographic projection of the first gate line 13 on the base substrate. The first gate line 13 may further include a conductive portion 134, and the conductive portion 134 may be used to form a gate of the fourth transistor T4. The third gate line 17 may include a conductive portion 175 and a conductive portion 176, the conductive portion 175 may be used to form a gate of the fifth transistor, and the conductive portion 176 may be used to form a gate of the sixth transistor. The gate of the seventh transistor T7 may share a conductive portion 147 in the second gate line 14 in the next row of pixel unit.

As shown in FIG. 15, the third conductive layer may further include a second connecting portion 39, a third connecting portion 310 and a data line 311. The second connecting portion 39 may be connected to an active layer on a side of the eighth active portion 68 through a via hole 96, so as to connect to the second electrode of the first transistor T1. The third connecting portion 310 may connect an active layer between the twelfth active portion 612 and the thirteenth active portion 613 through a via hole 97, so as to connect the second electrode of the sixth transistor T6 and the second electrode of the seventh transistor T7. The first electrode of the seventh transistor T7 may be connected to the second connecting portion 39 in the pixel unit of the next row. The data line 311 may be connected to the first electrode of the fourth transistor T4 through a via hole 98. As shown in FIG. 15, in this exemplary embodiment, the third conductive layer may include multiple data lines. For example, the third conductive layer may further include a data line 312, and orthographic projections of the multiple data lines on the base substrate are distributed at intervals in the second direction Y and extend in the first direction X. An orthographic projection of the data line 312 on the base substrate in FIG. 15 may be located between the orthographic projection of the power cord 322 on the base substrate and the orthographic projection of the fourth conductive portion 34 on the base substrate. As shown in FIG. 11, the orthographic projection of the data line 312 on the base substrate and the orthographic projection of the second conductive portion 12 on the base substrate at least partially overlap.

Figure 16:
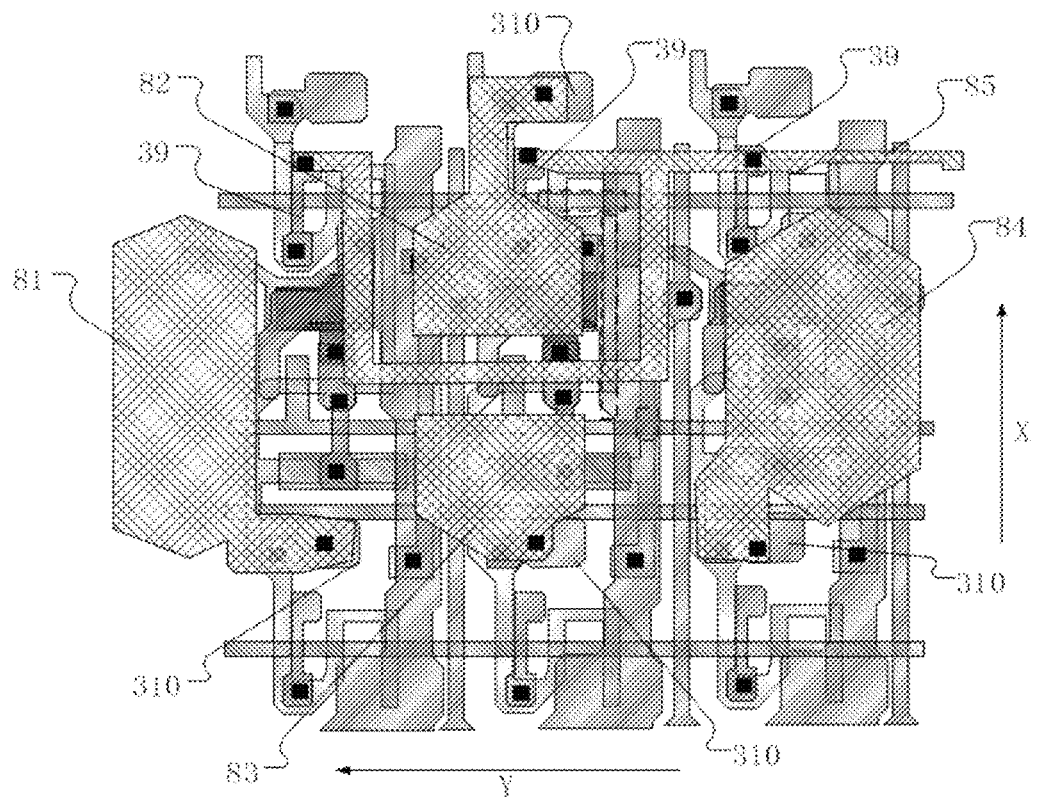
FIG. 16 is a structural layout of an array substrate of another exemplary embodiment of the present disclosure.
Figure 17:
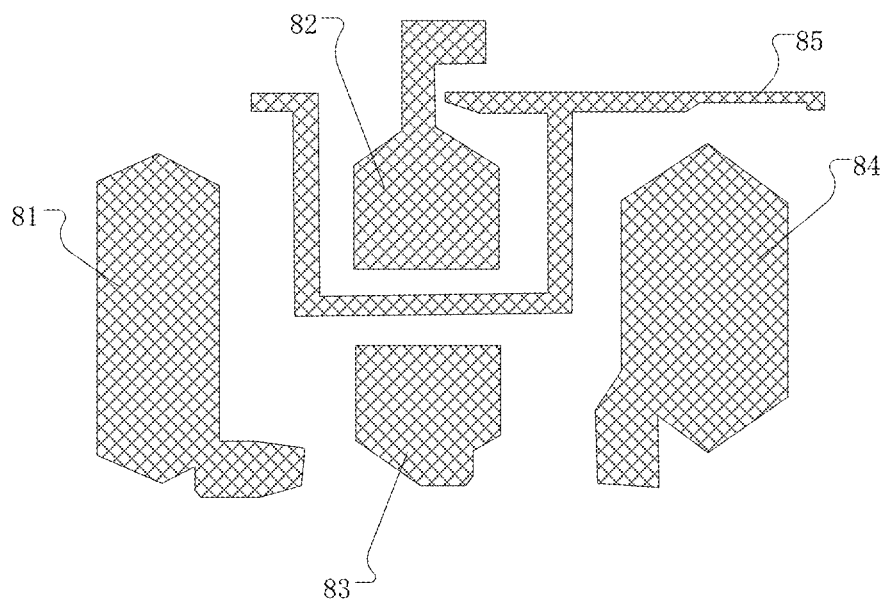
FIG. 17 is a structural layout of an anode layer in FIG. 16.

As shown in FIG. 16, it is a structural layout of an array substrate of another exemplary embodiment of the present disclosure. The array substrate may also include an anode layer, as shown in FIG. 17, which is a structural layout of the anode layer in FIG. 16. The array substrate may adopt a GGRB pixel arrangement, and the anode layer may include a first anode portion 81, a second anode portion 82, a third anode portion 83, a fourth anode portion 84 and an anode wiring 85. The first anode part 81 may form an anode of an R sub-pixel, the second anode part 82 and the third anode part 83 may form an anode of a G sub-pixel, and the fourth anode part 8 may form an anode of a B sub-pixel. The first anode portion 81, the third anode portion 83 and the fourth anode portion 84 may be connected to the third connecting portion 310 in the same row of pixel units through a via hole so as to connect to the second electrode of the seventh transistor T7 in this row of pixel drive circuits. The second anode portion 82 may be connected to the third connection portion 310 in the pixel unit of the adjacent upper row so as to connect the second electrode of the seventh transistor T7 in the pixel drive circuit of an adjacent upper row. The anode wiring 85 may be connected to the second connecting portion 39 in the same row of pixel units for providing the initialization signal terminal Vinit shown in FIG. 1.

This exemplary embodiment also provides a display device including the above-mentioned array substrate. The display device may be a display device such as a mobile phone, a tablet computer, or a television.

Those skilled in the art will easily think of other embodiments of the present disclosure after considering the specification and practicing the disclosure disclosed herein. This application is intended to cover any variations, uses or adaptive changes of the present disclosure. These variations, uses or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the claims.

It should be understood that the present disclosure is not limited to the precise structures that have been described above and shown in the drawings, and various modifications and changes may be made without departing from its scope. The scope of the present disclosure is limited only by the appended claims.

What is claimed is:

1. An array substrate, comprising:
   a pixel drive circuit, wherein the pixel drive circuit comprises a drive transistor and a capacitor connected to a gate of the drive transistor;
   a base substrate;
   a first conductive layer located on a side of the base substrate and comprising: a first conductive portion used to form the gate of the drive transistor; and a second conductive portion, wherein an orthographic projection of the second conductive portion on the base substrate does not intersect with an orthographic projection of the first conductive portion on the base substrate, and the second conductive portion is used to form a part of a first electrode of the capacitor;
   a second conductive layer disposed on a side of the first conductive layer away from the base substrate and comprising: a third conductive portion, wherein an orthographic projection of the third conductive portion on the base substrate and the orthographic projection of the second conductive portion on the base substrate at least partially overlap, the third conductive portion is electrically connected to the first conductive portion, and the third conductive portion is used to form a second electrode of the capacitor; and
   a third conductive layer disposed on a side of the second conductive layer away from the base substrate and comprising a fourth conductive portion and a power cord, wherein an orthographic projection of the fourth conductive portion on the base substrate and the orthographic projection of the third conductive portion on the base substrate at least partially overlap, the fourth conductive portion is electrically connected to the second conductive portion, the fourth conductive portion is used to form a part of the first electrode of the capacitor, the power cord is electrically connected to the fourth conductive portion, and the power cord is configured to provide a power signal to the first electrode of the capacitor.

2. The array substrate according to claim 1, wherein:
   the orthographic projection of the first conductive portion on the base substrate and the orthographic projection of the third conductive portion on the base substrate are distributed at intervals in the first direction, and
   the third conductive layer further comprises a first connecting portion extending in the first direction on an orthographic projection of the base substrate, and being electrically connected to the first conductive portion through a via hole and the third conductive portion through a via hole.

3. The array substrate according to claim 2, wherein:
   the fourth conductive portion comprises a first sub-conductive portion;
   an orthographic projection of the first sub-conductive portion on the base substrate does not intersect with the orthographic projection of the third conductive portion on the base substrate, and the orthographic projection of the first sub-conductive portion on the base substrate and the orthographic projection of the second conductive portion on the base substrate at least partially overlap; and
   the first sub-conductive portion is electrically connected to the second conductive portion through a via hole.

4. The array substrate according to claim 3, wherein:
   the power cord extends in the first direction, and the orthographic projection of the third conductive portion on the base substrate is located on a side of an orthographic projection of the power cord on the base substrate in a second direction, and the first direction intersects with the second direction; and
   the orthographic projection of the fourth conductive portion on the base substrate is located on the side of the orthographic projection of the power cord on the base substrate in the second direction.

5. The array substrate according to claim 4, wherein the array substrate comprises a plurality of pixel drive circuits; and the first conductive layer comprises a plurality of second conductive portions, orthographic projections of the plurality of second conductive portions on the base substrate being distributed at intervals in the second direction.

6. The array substrate according to claim 5, wherein:
   the third conductive layer comprises a plurality of power cords, the plurality of power cords are distributed at intervals in the second direction and comprise adjacent first power cord and second power cord, and an orthographic projection of the second power cord on the base substrate is located on a side of an orthographic projection of the first power cord on the base substrate in the second direction; and the second conductive portion is electrically connected to the first power cord through the first sub-conductive portion and to the second power cord through a via hole.

7. The array substrate according to claim 5, wherein:
the pixel drive circuit further comprises a second transistor, a first electrode of the second transistor is connected to a first electrode of the drive transistor, and a second electrode of the second transistor is connected to a gate of the drive transistor, and
the first conductive layer further comprises a first gate line, an orthographic projection of the first gate line on the base substrate extending in the second direction and being located between the orthographic projection of the first conductive portion on the base substrate and the orthographic projection of the second conductive portion on the base substrate, and a part of the first gate line being used to form a gate of the second transistor.

8. The array substrate according to claim 7, wherein;
the pixel drive circuit further comprises a first transistor, a first electrode of the first transistor is connected to the second electrode of the second transistor, and
the first conductive layer further comprises a second gate line, an orthographic projection of the second gate line on the base substrate extending in the second direction and being located on a side of the orthographic projection of the second conductive portion on the base substrate away from the orthographic projection of the first gate line on the base substrate, and a part of the second gate line being used to form a gate of the first transistor.

9. The array substrate according to claim 8, wherein:
the array substrate further comprises an active layer disposed between the base substrate and the first conductive layer;
the active layer comprises a first active portion, an orthographic projection of the first active portion on the base substrate extending in the first direction, and the first active portion being used to electrically connect the second electrode of the second transistor and the first electrode of the first transistor; and
the orthographic projection of the first active portion on the base substrate penetrates a gap between orthographic projections of adjacent second conductive portions on the base substrate.

10. The array substrate according to claim 9, wherein the third conductive layer further comprises:
a fifth conductive portion connected between the fourth conductive portion and the power cord, wherein the power cord comprises a first edge, the fifth conductive portion comprises a second edge connected to the first edge, and an angle formed by an orthographic projection of the first edge on the base substrate and an orthographic projection of the second edge on the base substrate is less than 180°; and
an orthographic projection of the fifth conductive portion on the base substrate and the orthographic projection of the first active portion on the base substrate at least partially overlap.

11. The array substrate according to claim 9, wherein;
the first conductive layer further comprises: a sixth conductive portion, an orthographic projection of the sixth conductive portion on the base substrate extending in the first direction and being connected to the first gate line;
the active layer further comprises:

a second active portion, an orthographic projection of the second active portion on the base substrate being located on the orthographic projection of the first gate line on the base substrate, and the second active portion being used to form a first channel region of the second transistor;
a third active portion, an orthographic projection of the third active portion on the base substrate being located on the orthographic projection of the sixth conductive portion on the base substrate, and the third active portion being used to form a second channel region of the second transistor; and
a fourth active portion connected between the second active portion and the third active portion, wherein an orthographic projection of the fourth active portion on the base substrate does not intersect with the orthographic projection of the first conductive layer on the base substrate; and
the third conductive layer further comprises: a seventh conductive portion connected to the fourth conductive portion, wherein an orthographic projection of the seventh conductive portion on the base substrate and the orthographic projection of the fourth active portion on the base substrate at least partially overlap.

12. The array substrate of claim 11, wherein;
the active layer further comprises a fifth active portion connected between the third active portion and the first active portion, wherein an orthographic projection of the fifth active portion on the base substrate does not intersect with the orthographic projection of the first conductive layer on the base substrate; and
the orthographic projection of the fifth active portion on the base substrate and the orthographic projection of the first connecting portion on the base substrate at least partially overlap, and the fifth active portion is electrically connected to the first connecting portion through a via hole.

13. The array substrate according to claim 9, wherein the active layer further comprises: a sixth active portion used to form a channel region of the drive transistor, and an orthographic projection of the sixth active portion on the base substrate being in a strip shape and extending in the second direction.

14. The array substrate according to claim 13, wherein a size of the orthographic projection of the sixth active portion on the base substrate in the first direction is 1.1-1.5 times a size of the orthographic projection of the first gate line on the base substrate in the first direction.

15. The array substrate according to claim 13, wherein the orthographic projection of the first conductive portion on the base substrate is in a strip shape extending in the second direction, and a size of the orthographic projection of the first conductive portion on the base substrate in the second direction is 2.5-5 times a size of the orthographic projection of the first conductive portion on the base substrate in the first direction.

16. The array substrate according to claim 9, wherein;
the active layer further comprises:
a seventh active portion, an orthographic projection of the seventh active portion on the base substrate being located on the orthographic projection of the second gate line on the base substrate, and the seventh active portion being used to form the first channel region of the first transistor;
an eighth active portion, an orthographic projection of the eighth active portion on the base substrate being located on the orthographic projection of the second gate line on the base substrate, and the eighth active portion being used to form the second channel region of the first transistor;

a ninth active portion connected between the seventh active portion and the eighth active portion, wherein an orthographic projection of the ninth active portion on the base substrate does not intersect with the orthographic projection of the first conductive layer on the base substrate; and the third conductive layer further comprises:

an eighth conductive portion electrically connected to the power cord;

the power cord comprises a third edge, the eighth conductive portion comprises a fourth edge connected to the third edge, and an angle formed by an orthographic projection of the third edge on the base substrate and an orthographic projection of the fourth edge on the base substrate is less than 180°; and an orthographic projection of the eighth conductive portion on the base substrate and the orthographic projection of the ninth active portion on the base substrate at least partially overlap.

17. The array substrate according to claim 6, wherein:

the third conductive layer further comprises a plurality of data lines, and orthographic projections of the plurality of data lines on the base substrate are distributed at intervals in the second direction and extend in the first direction;

the plurality of data lines comprise a first data line, and an orthographic projection of the first data line on the base substrate is located between the orthographic projection of the second power cord on the base substrate and the orthographic projection of the fourth conductive portion on the base substrate; and the orthographic projection of the first data line on the base substrate and the orthographic projection of the second conductive portion on the base substrate at least partially overlap.

18. A display device, comprising:

an array substrate, comprising:

a pixel drive circuit, wherein the pixel drive circuit comprises a drive transistor and a capacitor connected to a gate of the drive transistor;

a base substrate;

a first conductive layer located on a side of the base substrate and comprising: a first conductive portion used to form the gate of the drive transistor; and a second conductive portion, wherein an orthographic projection of the second conductive portion on the base substrate does not intersect with an orthographic projection of the first conductive portion on the base substrate, and the second conductive portion is used to form a part of a first electrode of the capacitor;

a second conductive layer disposed on a side of the first conductive layer away from the base substrate and comprising: a third conductive portion, wherein an orthographic projection of the third conductive portion on the base substrate and the orthographic projection of the second conductive portion on the base substrate at least partially overlap, the third conductive portion is electrically connected to the first conductive portion, and the third conductive portion is used to form a second electrode of the capacitor; and a third conductive layer disposed on a side of the second conductive layer away from the base substrate and comprising a fourth conductive portion and a power cord, wherein an orthographic projection of the fourth conductive portion on the base substrate and the orthographic projection of the third conductive portion on the base substrate at least partially overlap, the fourth conductive portion is electrically connected to the second conductive portion, the fourth conductive portion is used to form a part of the first electrode of the capacitor; and the power cord is electrically connected to the fourth conductive portion, and is configured to provide a power signal to the first electrode of the capacitor.

19. An array substrate, comprising:

a pixel drive circuit, wherein the pixel drive circuit comprises a drive transistor and a capacitor connected to a gate of the drive transistor;

a base substrate;

a first conductive layer located on a side of the base substrate and comprising: a first conductive portion used to form the gate of the drive transistor; and a second conductive portion, wherein an orthographic projection of the second conductive portion on the base substrate does not intersect with an orthographic projection of the first conductive portion on the base substrate, and the second conductive portion is used to form a part of a first electrode of the capacitor;

a second conductive layer disposed on a side of the first conductive layer away from the base substrate and comprising: a third conductive portion, wherein an orthographic projection of the third conductive portion on the base substrate and the orthographic projection of the second conductive portion on the base substrate at least partially overlap, the third conductive portion is electrically connected to the first conductive portion, and the third conductive portion is used to form a second electrode of the capacitor; and a third conductive layer disposed on a side of the second conductive layer away from the base substrate and comprising a fourth conductive portion and a power cord, wherein an orthographic projection of the fourth conductive portion on the base substrate and the orthographic projection of the third conductive portion on the base substrate at least partially overlap, the fourth conductive portion is electrically connected to the second conductive portion, the fourth conductive portion is used to form a part of the first electrode of the capacitor; the power cord extends in a first direction, the orthographic projection of the third conductive portion on the base substrate is located on a side of an orthographic projection of the power cord on the base substrate in a second direction, the first direction intersects with the second direction; the fourth conductive portion is electrically connected to the power cord, and the orthographic projection of the fourth conductive portion on the base substrate is located on the side of the orthographic projection of the power cord on the base substrate in the second direction.

* * * * *